United States Patent [19]

Kadowaki et al.

[11] Patent Number: 4,958,311
[45] Date of Patent: Sep. 18, 1990

[54] COMPOSITE FINITE IMPULSE RESPONSE DIGITAL FILTER

[75] Inventors: Yukio Kadowaki, Minoo; Shigeki Matsuoka, Suita; Shogo Nakamura, Matsudo, all of Japan

[73] Assignee: Ricoh Company, Ltd., Tokyo, Japan

[21] Appl. No.: 328,970

[22] Filed: Mar. 27, 1989

[30] Foreign Application Priority Data

Mar. 25, 1988 [JP] Japan .................................. 63-72788

[51] Int. Cl.⁵ ............................................. G06F 15/31
[52] U.S. Cl. ................................................ 364/724.01
[58] Field of Search ...................... 364/724.01, 724.03, 364/724.16, 724.17, 724.18, 724.19

[56] References Cited

U.S. PATENT DOCUMENTS

4,561,065 12/1985 Matsuda ......................... 364/724.17
4,782,459 11/1988 Johnston ........................ 364/724.19

Primary Examiner—Gary V. Harkcom
Assistant Examiner—Long T. Nguyen
Attorney, Agent, or Firm—Cooper & Dunham

[57] ABSTRACT

A composite finite impulse response digital filter for use in an image processing apparatus or the like includes a plurality of sub-filters connected in series. In each sub-filter, a random access memory (RAM) is provided for storing an input data and a barrel shifter is provided for shifting the data to a least significant bit (LSB) or most significant bit (MSB) side over the number of shifts corresponding to a first control signal. Because of the provision of the barrel shifter in each sub-circuit, it is not necessary to shift a data input into an input terminal over a predetermined number of bits before storing into the RAM. Thus, the memory capacity of the RAM can be significantly reduced in size.

5 Claims, 5 Drawing Sheets

COMPOSITE FINITE IMPULSE RESPONSE DIGITAL FILTER

BACKGROUND OF THE INVENTION

1. Field of the Invention

This invention generally relates to a digital filter for use in image processing apparatuses, electronic medical apparatuses or the like, and, in particular, to a composite finite impulse response digital filter.

2. Description of the Prior Art

Finite impulse response (FIR) digital filters were widely used in various image processing apparatuses storing waveform information to carry out a predetermined process because of their linear phase characteristic against frequency and their ability to operate stably. However, in implementing a digital filter having a sharp cut-off characteristic, the number of elements required for constructing hardware increases extremely as compared with the case using an infinite impulse response digital filter. There is also a software problem of increasing the amount of calculation required.

Figure 3:
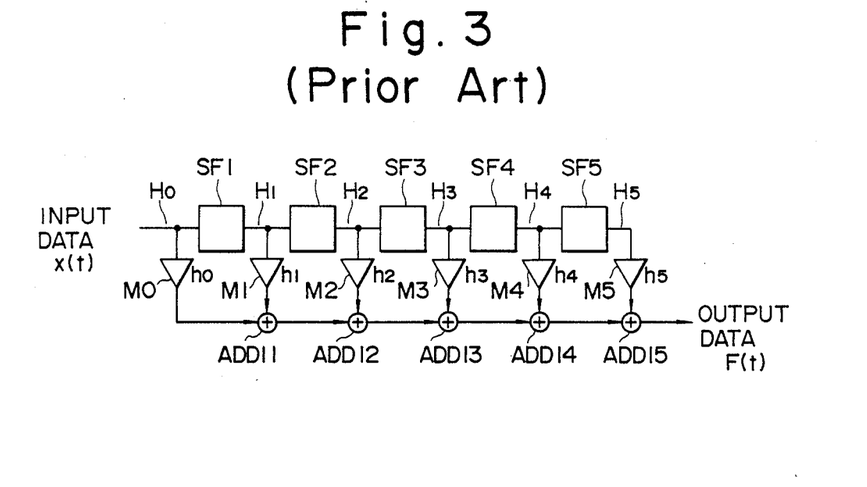
FIG. 3 is a block diagram showing a prior art FIR digital filter.

In order to solve these problems, there has been proposed a prior art composite FIR digital filter shown in FIG. 3. As shown, this composite FIR digital filter includes five sub-filters SF1-SF5 shown in FIG. 4 and six multipliers M0-M5 and five adders ADD-11-ADD15. A data input into this composite FIR filter is also input into the sub-filter SF1, and it is input into a first input terminal of adder ADD11 through the multiplier M0 having a multiplier factor h0. A data output from the sub-filter SF1 is input into the next stage of sub-filter SF2 and also into a second input terminal of ADD11 through the multiplier M1 having a multiplier factor h1. A data output from the adder ADD11 is input into a first input terminal of adder ADD12. On the other hand, a data output from the sub-filter SF2 is input into the next stage of sub-filter SF3 and also into a second input terminal of adder ADD12 through the multiplier M2 having a multiplier factor h2. Similarly, an output data from each of the output terminals of preceding stage adders ADD12 through ADD14 is input into a corresponding one of the first input terminals of adders ADD13 through ADD15; on the other hand, data output from the sub-filters SF3 through SF5 are input into the second input terminals of adders ADD13 through ADD15, respectively, through the respective multipliers M3 through M5. Finally, an output data from this composite FIR digital filter is output from an output terminal of the adder ADD15.

Figure 4:
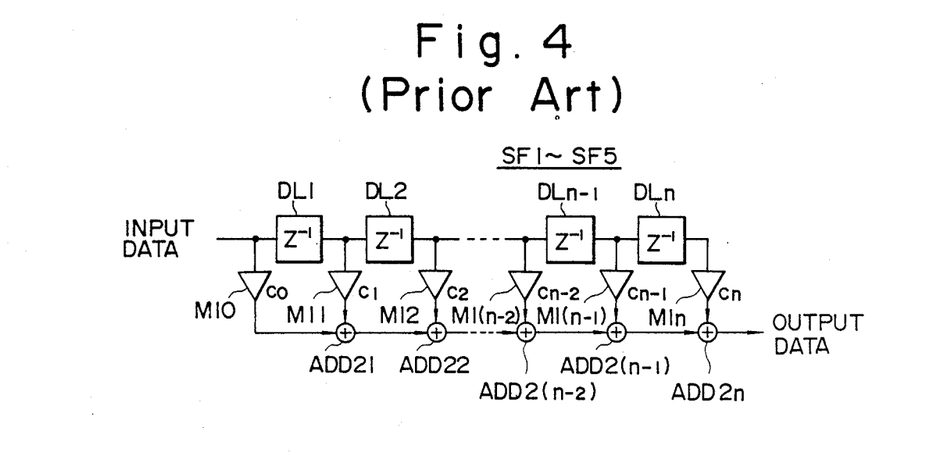
FIG. 4 is a block diagram showing the structure of a sub-filter provided in the digital filter shown in FIG. 3.

FIG. 4 illustrates in block form the sub-filters SF1 through SF5 of the structure shown in FIG. 3. As shown in FIG. 4, the sub-filters SF1 through SF5 are respectively provided with n (integer) number of delay elements DL1 through DLn having a transfer function $z^{-1}$ and (n+1) number of multipliers M10 through M1n having multiplier factors C0 through Cn, respectively, and an n-stage structure is constructed by replacing the sub-filters SF1 through SF5 with the delay elements DL1 through DLn in a manner similar to the 5-stage composite FIR digital filter shown in FIG. 3.

Designating the data input into the composite FIR digital filter of FIG. 3 by x(t) and the data output from this digital filter by Hi(t), where t is time and i = 1, 2, 3, 4 or 5, an output data F(t) of the composite FIR digital filter and the output data Hi(t) of the sub-filters SF1 through SF5, wherein I=1, 2, 3, 4 or 5, may be expressed in the following manner.

$$F(t) = \sum_{i=0}^{5} hi \cdot Hi(t) \quad (1)$$

$$Hi(t) = \sum_{j=0}^{n} Cj \cdot Hi - 1(t - j) \quad (2)$$

Here, H0(t)=x(t) and hi and Cj are multiplier factors of multipliers M0 through M5 and M10 through M1n.

Figure 2:
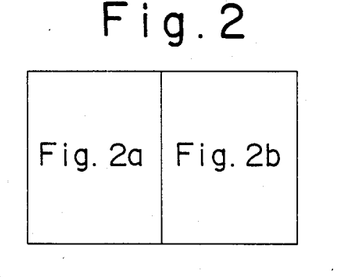
FIG. 2 is an illustration showing how to combine FIGS. 2a and 2b.
Figure 2A:
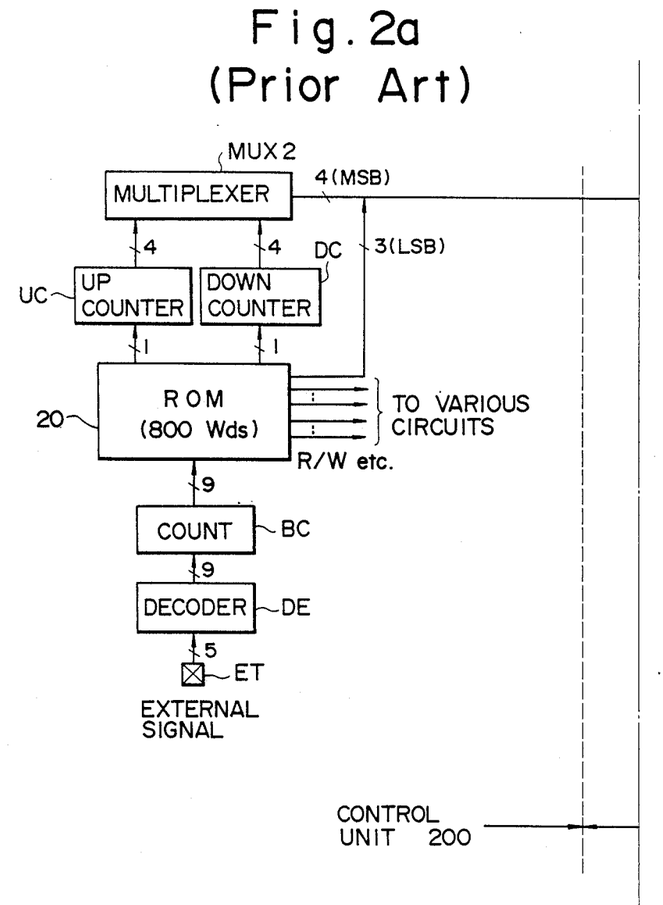
FIGS. 2a and 2b, when combined as shown in FIG. 2, define a block diagram showing a prior art FIR digital filter.
Figure 2B:
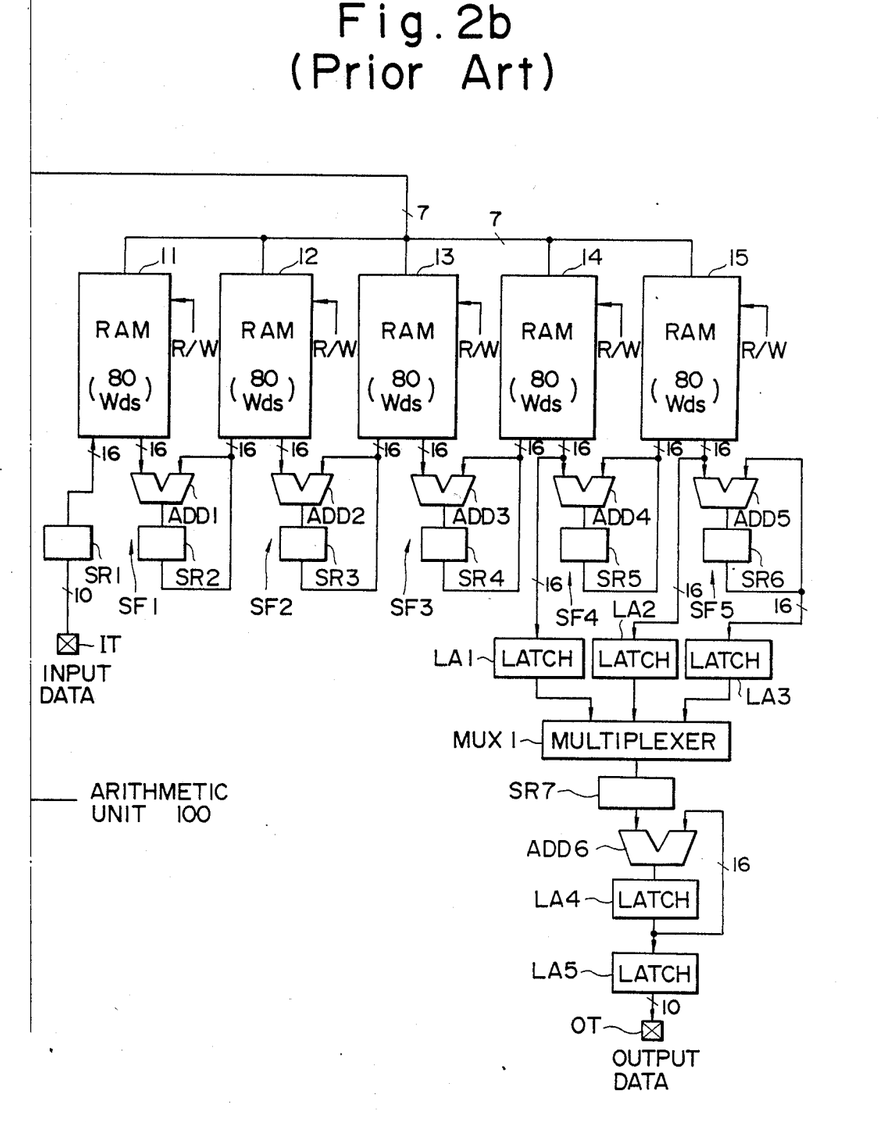

FIGS. 2a and 2b, when combined as shown in FIG. 2, define a prior art integrated circuit including realization of the composite FIR digital filter of FIG. 3 for h0=h1=h2=0. In this integrated circuit, a 10-bit data is input into an input terminal IT and it is processed through the composite FIR digital filter, the result of which is output to an output terminal OT. The integrated circuit includes an arithmetic unit 100 and a control unit 200 for controlling the operation of the arithmetic unit 100.

In the control unit 200, a decoder DE decodes a 5-bit control signal, which has been input through an external terminal ET, to thereby convert it into a 9-bit control signal which in turn is output to a counter BC. In response to the incoming 9-bit control signal, the counter BC carries out a sequential control operation of this digital filter to have a 9-bit address output to a read only memory (ROM) 20. A system program for controlling the operation of the FIR digital filter is stored in the ROM 20, and based on instructions stored in the addresses input from the counter BC, a control signal is output to each component of the arithmetic unit 100. At the same time, a 3-bit address at the least significant bit (LSB) side is output while a 1-bit increment signal is output to an up counter UC or a 1-bit decrement signal is output to a down counter DC. In response to an increment signal, the up counter UC adds "1" to its count and outputs a 4-bit address at a most significant bit (MSB) side to a random access memory (RAM) 11 through 15 of the arithmetic unit 100. On the other hand, the down counter DC responds to a decrement signal to subtract "1" from its count to have a 4-bit address at the MSB side output to RAM 11 through 15 of the arithmetic unit 100.

In the arithmetic unit 100, eleven 10-bit parallel data are input into the input terminal IT in parallel and serial fashion, and after shifting the data input into the input terminal IT to the right or toward the LSB side over 0 through 5 bits, a shift register SR1 outputs the thus shifted 16-bit data to the RAM 11. The data is then written into an address which corresponds to the 7-bit address output from the control unit 200.

Thus, in the RAM 11, a 16-bit data (also referred to as shift data, hereinafter) which has been shifted over 0 through 5 bits for a 16-bit input data is stored in its addresses 0 through 5. As a result, in the RAM 11, a total of sixty-six 16-bit shift data for eleven 16-bit input data are stored. The RAM 11 includes a 14-word marginal memory region and thus it has a total of 80 word memory capacity. It is to be noted that one word includes sixteen bits.

Eleven 16-bit data output from the RAM 11 are input into the first input terminal of the adder ADD1 and a 16-bit data output from the adder ADD1 is input into the second input terminal of the adder ADD1 through a shift register SR2 and also to the RAM 12. The RAM 11, adder ADD1 and shift register SR2 together define the sub-filter SF1. That is, after adding a predetermined one of the six shift data for a single input data stored in the RAM 11 to the data input into the second input terminal of the adder ADD1, the result is input into the second input terminal of the adder ADD1 with or without shifting to the LSB side over one bit by the shift register SR1 based on a control signal output from the ROM 20. The above-described procedure is repetitively carried out over a predetermined number of times to thereby obtain an output data H1 of the sub-filter SF1 from the output of the shift register SR1. The above-described procedure is often referred to as "shift and add" procedure.

The output data H1 is output to address 0 of the RAM 12, and using this output data H1 and the shift register SR1, the data is shifted to the LSB side over 1 through 5 bits in a manner similar for the input data input into the input terminal IT to thereby produce a total of six shift data. Shift data having the shift bit numbers of 1 through 5 bits, respectively, are output and stored at addresses 1 through 5 of the RAM 12, respectively. Thus, in the RAM 12, a total of sixty-six 16-bit shift data for the eleven 16-bit data output from the sub-filter SF1 are stored.

Similarly, the RAM 12, adder ADD2 and shift register SR3 together define the sub-filter SF2 and the RAM 13, adder ADD3 and shift register SR4 together define the sub-filter SF3. Furthermore, the RAM 14, adder ADD4 and shift register SR5 together define the sub-filter SF4, and the RAM 15, adder ADD5 and shift register SR6 together define the sub-filter SF5. The sub-filters SF2 through SF5 constructed as described above operate in a manner similar to that of the sub-filter SF1.

Six data among the total of sixty-six shift data stored in the RAM 14 are output data H3 of the sub-filter SF3, and this output data H3 is output to the first input terminal of a multiplexer MUX1 through a latch circuit LA1. Similarly, six data among the total of sixty-six shift data stored in the RAM 15 define an output data H4 of the sub-filter SF4 and this output data H4 is output to the second input terminal of the multiplexer MUX1 through a latch circuit LA2. In addition, an output data H5 of the sub-filter SF5 is latched into a latch circuit LA3 and thereafter it is input into the third input terminal of the multiplexer MUX1. The multiplexer MUX1 selects one of the 16-bit data input into its first, second and third input terminals and the thus selected data is output to the first input terminal of the adder ADD 6 through the shift register SR7. The adder ADD6 adds the 16-bit data input into the first input terminal to the 16-bit data input into the second input terminal and the 16-bit data of the thus added result is output to the latch circuit LA5 through the latch circuit LA4 and also to the second input terminal of the adder ADD6. Furthermore, the latch circuit LA5 outputs a 10-bit data at the MSB side of the 6-bit data latched into the latch circuit LA5 to the output terminal OT.

The multiplexer MUX1, shift register SR7, adder ADD6 and latch circuit LA4 shift each data input into each input terminal of the multiplexer MUX1 toward the LSB side over a predetermined number of bits using the shift register SR7 similarly with the sub-filters SF1 through SF5, and the data is added using the adder ADD6, i.e., carrying out the above-mentioned shift and add procedure, to operate the multipliers M3 through M5 and the adders ADD13 through ADD15 of FIG. 3, thereby allowing to obtain an output data F(t) of the composite FIR digital filter. After having been latched in the latch circuit LA5, the data F(t) is output to the output terminal OT.

However, in the above-described composite FIR digital filter, since it is required to store six shift data for each data in each of the RAMs 11 through 16 so as to carry out the shift and add procedure of the sub-filters SF1 through SF5, the RAMs 11 through 15 are required to have an extremely large memory capacity. Besides, as described above, it is required to store six shift data for each data before the shift and add procedure and unnecessary data which are not used in the operation of the sub-filters SF1 through SF5 are also produced and stored so that there is a problem of presence of an unnecessary process cycle.

SUMMARY OF THE INVENTION

In accordance with the present invention, there is provided a composite FIR digital filter including an n plurality of sub-filters, where n is an integer, each of said sub-filters comprising: first storing means for storing a data input into an input terminal of a sub-filter; first shifting means for shifting a data output from said first storing means to a LSB or MSB side over the number of shifts corresponding to a first control signal; first adding means having first and second input terminals for adding a data input into the first input terminal from said first shifting means to a data input into said second input terminal; and second storing means for temporarily storing a data output from said first adding means and outputting said data thus stored to the second input terminal of said first adding means, whereby an output terminal of a preceding sub-filter is connected to an input terminal of a following sub-filter to have said n number of sub-filters connected in series and there is provided a multiplying and adding means for multiplying each data output from each of said sub-filters by a multiplier factor corresponding to a second control signal and adding the thus multiplied data together to output the thus added data as an output data.

In the preferred embodiment, the first shifting means includes a barrel shifter. In the preferred embodiment, the data which are multiplied by the multiplying and adding means are data output from each of a predetermined number of sub-filters in the lower stages. Also in the preferred embodiment, the multiplying and adding means includes: switching means for selectively selecting and outputting a predetermined one of the data output from said sub-filters; second shifting means for shifting the data output from said switching means to a LSB or MSB side over a number of shifts corresponding to a second control signal; second adding means having third and fourth input terminals and adding a data output from said second shifting means and input into said third input terminal to a data input into said fourth input terminal; and third storing means for temporarily storing a data output from said second adding means, outputting said data to said fourth input terminal of said second adding means and outputting said data as an output data.

In addition, in the preferred embodiment, the second shifting means includes a barrel shifter.

With the above-described structure, in the first place, in the first sub-filter, a data input into the input terminal is stored by the first storing means and the data output from the first storing means is shifted to a LSB or MSB side over a number of shifts corresponding to the first control signal. Then, the first adding means adds the data input into the first input terminal from the first shifting means to the data input into the second input terminal, and the second storing means temporarily stores the data output from the first adding means with the thus stored data being output to the second input terminal of the first adding means. The above-described process is repetitively carried out over a predetermined number of times to apply an arithmetic operation of the composite FIR digital filter expressed by equation (2) to the data stored in the first storing means. The result data of the arithmetic operation is output from the second storing means to the input terminal of the next stage of the second sub-filter. The above-described operation is carried out for each of the predetermined number n of the sub-filters which are connected in series.

In addition, the multiplying and adding means multiplies each data output from each of the sub-filters by a multiplier factor corresponding to the second control signal and adds the thus multiplied data together to produce an added data which in turn is output as an output data. In this manner, there is obtained a resultant data of the calculation implemented by the composite FIR digital filter.

Preferably, the first shifting means includes a barrel shifter. If desired, the data to be multiplied by the multiplying and adding means may be each of the data output from each of a predetermined number of sub-filters in the trailing end of the series of sub-filters. Preferably, the multiplying and adding means can be constructed by the switching means, second shifting means, second adding means and third storing means as described above. With this structure, the switching means selectively selects and outputs a predetermined one of the data output from the sub-filters and the second shifting means shifts the data output from the switching means to a LSB or MSB side over the number of shifts corresponding to the second control signal. Then, the second adding means adds the data output from the second shifting means and input into the third input terminal to the data input into the fourth input terminal, and the third storing means temporarily stores the data output from the second adding means while outputting it to the fourth input terminal of the second adding means as well as an output data. The above-described process is repetitively carried out similarly with the sub-filters to have the data resulting from the operation of the composite FIR digital filter output from the third storing means. Preferably, the second shifting means includes a barrel shifter.

It is therefore a primary object of the present invention to obviate the disadvantages of the prior art as described above and to provide an improved composite finite impulse response digital filter.

Another object of the present invention is to provide an improved composite FIR digital filter having a memory capacity smaller than that required in the prior art.

A further object of the present invention is to provide an improved composite FIR digital filter having a shorter process time than that of the prior art.

Other objects, advantages and novel features of the present invention will become apparent from the following detailed description of the invention when considered in conjunction with the accompanying drawings.

DESCRIPTION OF THE PREFERRED EMBODIMENTS

Figure 1:
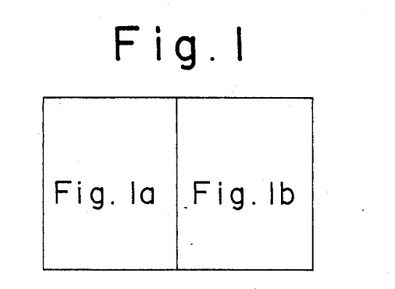
FIG. 1 is an illustration showing how to combine FIGS. 1a and 1b.
Figure 1A:
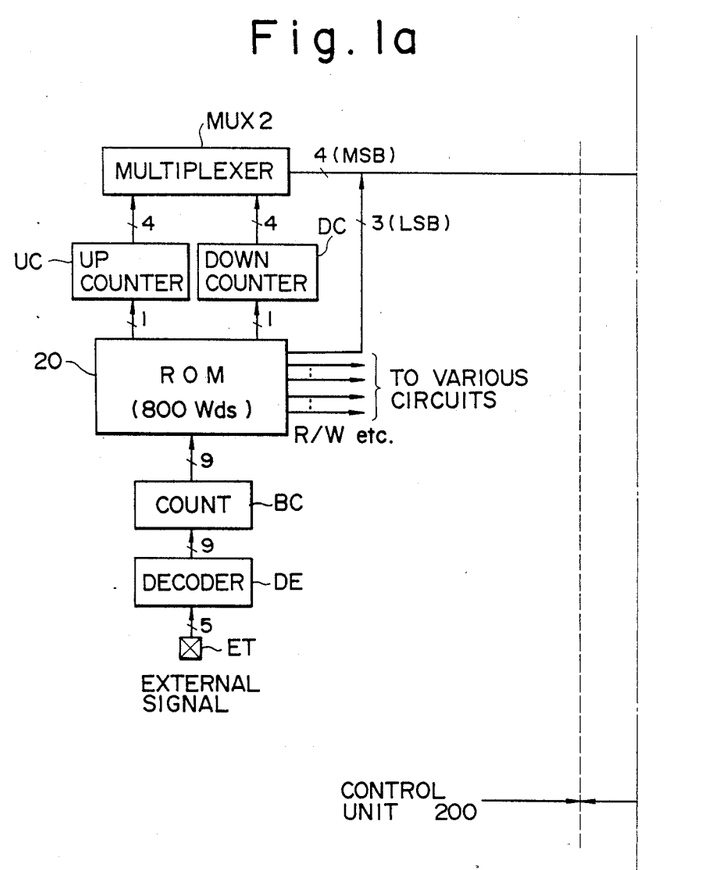
FIGS. 1a and 1b, when combined as shown in FIG. 1, define a block diagram showing a composite FIR digital filter constructed in accordance with one embodiment of the present invention.
Figure 1B:
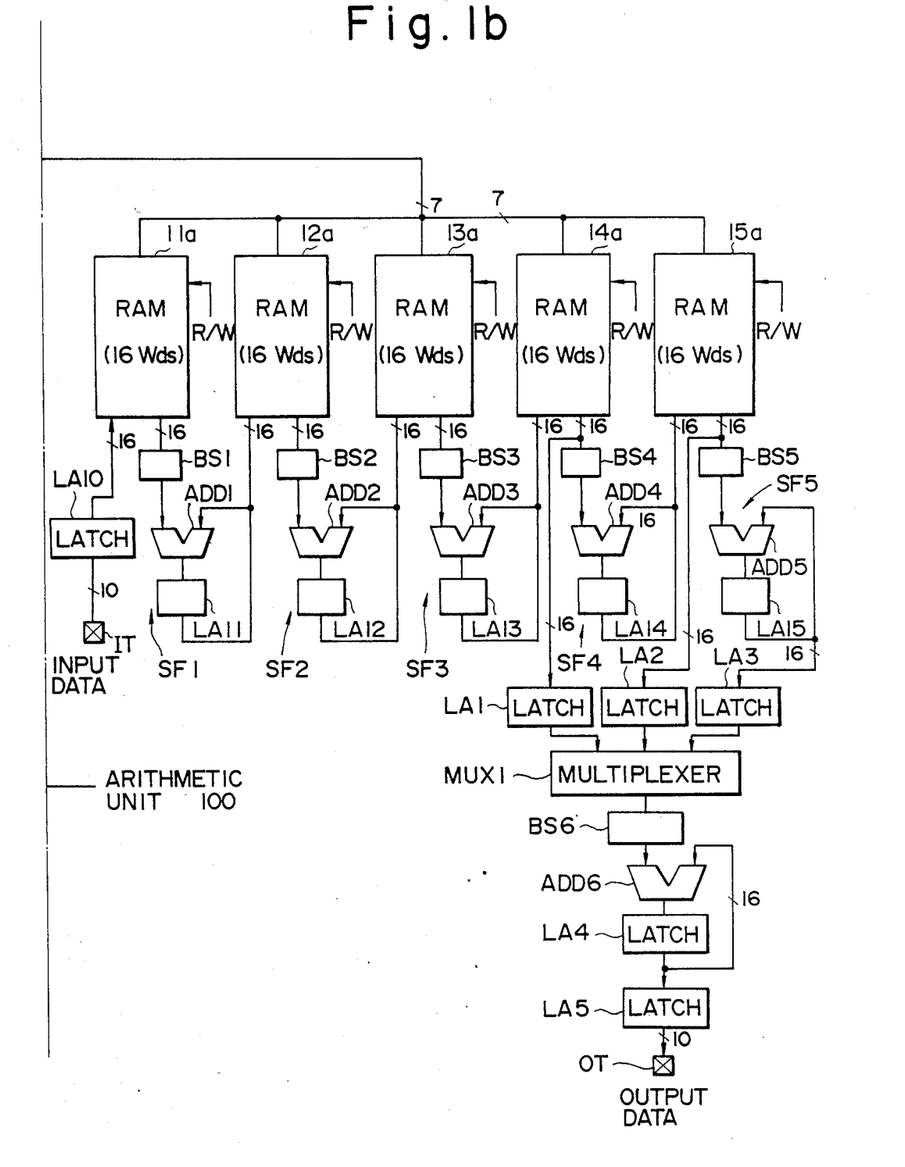

Referring now to FIGS. 1a and 1b, there is shown in block form a composite FIR digital filter implemented in the form of an integrated circuit in accordance with one embodiment of the present invention. It is to be noted that like numerals are used to indicate like elements throughout the drawings.

As compared with the prior art digital filter shown in FIGS. 2a and 2b, the integrated circuit of the present digital filter includes a plurality of 16-word RAMs $11a$ through $15a$ having a relatively small memory capacity. Barrel shifters BS1 through BS5 are provided between the RAMs $11a$ through $15a$ and the input terminals of adders ADD1 through ADD5, respectively. And, latch circuits LA10 through LA15 are provided in place of the shift registers SR1 through SR6, and a barrel shifter BS6 is provided in place of the shift register SR6.

In the arithmetic unit 100, after latching eleven 10-bit data input into the input terminal IT, the latch circuit LA10 adds 6-bit "0s" to the side above the MSB of the 10-bit data to define a 16-bit data which is then output to the RAM $11a$ and written into an address which corresponds to a 7-bit address data output from the control unit 200. Thus, in the RAM $11a$, eleven 16-bit input data are stored from address 0 to address 10. The memory capacity of the RAM $11a$ is 16 words in total, including a marginal memory region having five words. Eleven 16-bit data output from the RAM $11a$ are input into the barrel shifter BS1, which outputs the incoming data to the first input terminal of the adder ADD1 without shifting in response to a control signal containing the data of the number of shifts output from the ROM 20 of the control unit 200 or with shifting to the LSB over the number of bits corresponding to said number of shifts. The 16-bit data output from the adder ADD1 is input into the second input terminal of the adder ADD1 and the RAM 12 through the latch circuit LA11.

The RAM $11a$, barrel shifter BS1, adder ADD1 and latch circuit LA11 together define the sub-filter SF1. That is, after adding the data, which is obtained without shifting one input data stored in the RAM $11a$ by the barrel shifter BS1 or with shifting over a predetermined number of bits to the LSB side, to the data output from the latch circuit LA 11 and input into the second input terminal of the adder ADD1, the resulting added data is input into the second input terminal of the adder ADD1 through the latch circuit LA11. The above-described shift and add procedure is repetitively carried out over a predetermined number of times to obtain an output data H1 of the sub-filter SF1 as an output from the latch circuit LA11. In addition, by repetitively carrying out the above-described process for the total of eleven input data, the total of eleven output data H1 of the sub-filter SF1 can be obtained. The total of eleven output data H1 is output and stored in addresses 0 through 10 of the RAM 12.

Similarly, the RAM 12a, barrel shifter BS2, adder ADD2 and latch circuit LA12 together define the sub-filter SF2. The RAM 13a, barrel shifter BS3, adder ADD3 and latch circuit LA13 together define the sub-filter SF3. The RAM 14a, barrel shifter BS14, adder ADD4 and latch circuit LA14 together define the sub-filter SF4. In addition, the RAM 15a, barrel shifter BS5, adder ADD5 and latch circuit LA15 together define the sub-filter SF5. All of those sub-filters SF2 through SF5 constructed as set forth above operate in a manner similar to that of the sub-filter SF1.

The total of eleven data stored in the RAM 14a is the output data H3 from the sub-filter SF3, and this output data H3 is output to the first input terminal of the multiplexer MUX1 through the latch circuit LA1. Similarly, the total of eleven shift data stored in the RAM 15 is the output data H4 of the sub-filter SF4 and this output data H4 is output to the second input terminal of the multiplexer MUX1 through the latch circuit LA2. Moreover, the output data H5 of the sub-filter SF5 is first latched into the latch circuit LA3 and then input into the third input terminal of the multiplexer MUX1.

The multiplexer MUX1 selectively selects one of 16-bit data input into the first, second and third input terminals and the selected data is output to the first input terminal of the adder ADD6 through the barrel shifter BS6. The adder ADD6 adds the 16-bit data input into the first input terminal to the 16-bit data input into the second input terminal, and the resulting 16-bit data is output to the latch circuit LA5 through the latch circuit LA4 and also to the second input terminal of the adder ADD6. In addition, the latch circuit LA5 causes a 10-bit data among the latched 16-bit data to be output to the output terminal OT.

The multiplexer MUX1, barrel shifter BS6, adder ADD6 and latch circuit LA4 cause the input data to be shifted to the LSB side over the number of bits corresponding to the number of shifts contained in a control signal output from the ROM 20 using the barrel shifter BS6 in a manner similar to the sub-filters SF1 through SF5 described above for each data input into each of the input terminals of the multiplexer MUX1 and then the data are added using the adder ADD6 to thereby carry out the shift and add operation to operate the multipliers M3 through M5 and the adders ADD13 through ADD15, whereby an output data F(t) of the composite FIR digital filter is obtained. The data F(t) is latched in the latch circuit LA5 and then output to the output terminal OT.

The operation of the composite FIR digital filter in the form of an intergrated circuit having the above-described structure will now be described. The control unit 200 operates in response to a control signal input into an external terminal ET as in the prior art, and the ROM 20 of the control unit 200 outputs the addresses of the three bits of the LSB side to RAMs 11a through 15a and a predetermined control signal to each component circuit of the arithmetic unit 100. The multiplexer MUX2 of the control unit 200 outputs a 4-bit address at the MSB side to RAMs 11a through 15a. Eleven data input into the input terminal IT are stored into the RAM 11a through the latch circuit LA10. Eleven 16-bit data output from the RAM 11a are input into the barrel shifter BS1, which in response thereto causes the input data to be output to the second input terminal of the adder ADD1 without shifting in response to a control signal containing the data of the number of shifts output from the ROM 200 of the control unit 200 or with shifting to the LSB side over the number of bits corresponding to the above-mentioned number of shifts. The 16-bit data output from the adder ADD1 is input into the second input terminal of the adder ADD1 and into the RAM 12 through the latch circuit LA11.

By repeating the shift and add operation at the sub-filter SF1 over a predetermined number of times, the output data H1 of the sub-filter SF1 can be obtained from the output of the latch circuit LA11. Moreover, by carrying out the above-described process for the total of eleven input data, the total of eleven output data H1 of the sub-filter SF1 can be obtained. The total of eleven output data H1 is output and stored at addresses 0 through 10 of the RAM 12. Similarly, output data H2 and H5 can be obtained by the sub-filters SF2 through SF5 and these data H2 through H5 are stored into the RAMs 13a through 15a and the latch circuit LA3. In addition, the output data H3 and H4 are output and latched into the latch circuits LA1 and LA2, respectively. The data H3 through H5 latched into the latch circuits LA1 through LA3, respectively, are input into the respective first through third input terminals of the multiplexers MUX1.

In a structure including the multiplexer MUX1, barrel shifter BS6, adder ADD6 and latch circuit LA4, for each of the data input into each of the input terminals of the multiplexer MUX1, similarly with the above-described sub-filters SF1 through SF5, the input data is shifted using the barrel shifter BS6 to the LSB side based on a control signal containing the number of shifts output from the ROM 20 over the number of bits corresponding to the number of shifts and then the data are added using the adder ADD6 to thereby carry out the above-described shift and add operation to operate the multipliers M3 through M5 and the adders ADD13 through ADD15 of FIG. 3, whereby an output data F(t) of the composite FIR digital filter expressed by equation (1) can be obtained. The data F(t) is latched into the latch circuit LA5 and then output to the output terminal OT.

As described above, it is so structured that the sub-filters SF1 through SF5 are provided with barrel shifters BS1 through BS5, respectively, and based on the data of the number of shifts output from the ROM 20 of the control unit 200, shifting is carried out over the number of shifts, and, therefore, it is not necessary to previously store the data input into the input terminal IT and the shift data obtained by shifting the data output from each of the sub-filters SF1 through SF4 over 0 through 5 bits in the RAMs 11a through 15a as required in the prior art. Accordingly, the total of eleven 16-bit data is only stored in the RAMs 11a through 15a without shift so that the RAMs 11a through 15a may be significantly reduced in memory capacity as compared with the prior art. Thus, the memory capacity of each of the RAMs 11a through 15a of the above-described embodiment of the present invention is approximately 1/5 of the memory capacity required for each of the RAMs 11 through 15 of the prior art structure. It should be noted that this allows to significantly reduce the chip area occupied by the present composite FIR digital filter when implemented on a chip.

Moreover, in accordance with the present invention, since it is not necessary to previously carry out a shift operation by the shift registers SR1 through SR5, the time required for shift operation is reduced as compared with the prior art so that the processing time of the present composite FIR digital filter can be remarkably reduced. In addition, in the case where the barrel shifters BS1 through BS5 can shift the input data to the LSB side over the number of shifts larger than the maximum number of shifts (e.g., the maximum number of shifts in the above-described prior art is 5.) stored in the prior art RAMs 11 through 15, since the barrel shifters allow to obtain the data which has been shifted to the LSB side over a larger number of shifts as compared with the prior art, the round-off accuracy of the multiplier factors h0 through h5 of the multipliers M0 through M5 can be enhanced.

In the above-described embodiment, the barrel shifters BS1 through BS6 are so structured to output the input data as shifted to the LSB side; however, the present invention should not be limited only to this structure and it may also be so structured to carry out shifting to the MSB side. In the above-described embodiment, the barrel shifter BS6 is provided between the output terminal of the multiplexer MUX1 and the first input terminal of the adder ADD6. Alternatively, the provision be made of a shift register SR7 similarly with the prior art. In the above-described embodiment, it is assumed that factors h0, h1 and h2 of the multipliers of the composite FIR digital filter are zero. In an alternative structure, in the case where factors h0, h1 and h2 are finite constants, it may be so structured that additional three input terminals are added to the multiplexer MUX1 and the data output from the RAMs 11a through 13a are once latched into the latch circuits LA1 through LA3, respectively, and then output to the respective input terminals of the multiplexer MUX1.

In the above-described embodiment, the composite FIR digital filter has five stages. However, the composite FIR digital filter may have any other desired number n of stages, where n is an integer.

As described above, in accordance with the present invention, each sub-filter includes a first shift means, for example, of a barrel shifter and it is so structured to carry out shifting to the LSB or MSB side over the number of shifts corresponding to a first control signal. Accordingly, it is not necessary to form shift data obtained by shifting the data input into the input terminal IT and the data output from each of the sub-filters SF1 through SF4 over 0 through 5 bits in a first storing means, for example, of a RAM as in the prior art. Thus, only the data which have not been shifted are stored in the first storing means of each of the sub-filters so that the memory capacity of the first storing means, for example, of a RAM can be reduced significantly as compared with the prior art. As a result, the chip area required by the present composite FIR digital filter can also be reduced significantly. In addition, since it is not necessary to previously carry out a shift operation before writing into the first storing means as described above, the time required for the shift operation is significantly reduced as compared with the prior art and the processing time required by the present composite FIR digital filter can be significantly reduced.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A composite finite impulse response digital filter including a cascade arrangement of sub-filters, and a first latch for storing data input into a first one of said sub-filters, each of said sub-filters comprising:
   a barrel shifter which in the case of the first sub-filter in the cascade shifts data output from said first latch and in the case of each other sub-filter in the cascade shifts data output from the preceding sub-filter in the cascade, wherein each barrel shifter shifts the respective data input thereto to a selected one of the least significant bit side and the most significant bit side of the data over a number of shifts corresponding to a first control signal;
   first adding means having first and second input terminals for adding data input into the first input terminal from the respective barrel shifter and data input into the second input terminal; and
   second storing means for temporarily storing data output from said first adding means and outputting said data thus stored to the second input terminal of said first adding means and also, in the case of all but the last sub-filter in the cascade, to an input terminal of the next sub-filter in the cascade;
   wherein an output terminal of a preceding sub-filter is connected to an input terminal of the next sub-filter to have said sub-filters connected in series; and
   said digital filter including a multiplying and adding means for multiplying data output from each of a selected number of said sub-filters by a multiplier factor corresponding to a second control signal and adding the thus multiplied data to produce added data which in turn are output as output data of said cascade.

2. The filter of claim 1, wherein said second storing means in each sub-filter comprises a second latch.

3. The filter of claim 1, wherein the data multiplied by said multiplying and adding means are the data output from a predetermined number of sub-filters from the end of the cascade opposite said first sub-filter.

4. The filter of claim 1, wherein said multiplying and adding means includes:
   switching means for selectively selecting and outputting predetermined data output from said sub-filters;
   second shifting means for shifting data output from said switching means to a selected one of the LSB and the MSB side over a number of shifts corresponding to a second control signal;
   second adding means having third and fourth input terminals for adding data output from said second shifting means and input into said third input terminal to data input into said fourth input terminal; and
   third storing means for temporarily storing data output from said second adding means and outputting said data to said fourth input terminal of said second adding means and also as output data of said digital filter.

5. The filter of claim 4, wherein said second shifting means includes a second barrel shifter.

* * * * *